(12) United States Patent
Piquette et al.

(10) Patent No.: US 8,242,684 B2
(45) Date of Patent: *Aug. 14, 2012

(54) LED WAVELENGTH-CONVERTING PLATE WITH MICROLENSES

(75) Inventors: Alan Piquette, Peabody, MA (US); Madis Raukas, Charlestown, MA (US)

(73) Assignee: Osram Sylvania Inc., Danvers, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/891,315

(22) Filed: Sep. 27, 2010

(65) Prior Publication Data

US 2012/0074836 A1    Mar. 29, 2012

(51) Int. Cl.
*H01J 1/62* (2006.01)
*H01J 63/04* (2006.01)

(52) U.S. Cl. ........ 313/501; 313/483; 313/500; 313/502; 313/503; 313/504; 313/505; 313/506

(58) Field of Classification Search .................. None
See application file for complete search history.

(56) References Cited

U.S. PATENT DOCUMENTS

| | | | |
|---|---|---|---|
| 6,956,247 B1 | 10/2005 | Stockman | |
| 7,341,878 B2 * | 3/2008 | Krames et al. | 438/22 |
| 7,361,938 B2 | 4/2008 | Mueller et al. | |
| 7,554,258 B2 | 6/2009 | Rossner et al. | |
| 2003/0020399 A1 * | 1/2003 | Moller et al. | 313/504 |
| 2004/0145308 A1 | 7/2004 | Rossner et al. | |
| 2008/0116467 A1 | 5/2008 | Mueller et al. | |
| 2008/0121911 A1 * | 5/2008 | Andrews et al. | 257/98 |
| 2009/0206325 A1 * | 8/2009 | Biwa et al. | 257/28 |
| 2010/0002449 A1 | 1/2010 | Lin | |
| 2010/0046234 A1 * | 2/2010 | Abu-Ageel | 362/308 |
| 2010/0187976 A1 | 7/2010 | Winkler | |
| 2011/0162711 A1 * | 7/2011 | Takeuchi et al. | 136/257 |
| 2012/0074835 A1 * | 3/2012 | Piquette et al. | 313/501 |

FOREIGN PATENT DOCUMENTS

| | | |
|---|---|---|
| CN | 101826587 | 9/2010 |
| DE | 102004052456 | 4/2006 |
| JP | 2005-268323 | 9/2005 |
| WO | WO 2006/087651 | 8/2006 |
| WO | WO 2009/158158 | 12/2009 |
| WO | WO 2010/103840 | 9/2010 |

OTHER PUBLICATIONS

U.S. Appl. No. 12/891,281, filed Sep. 27, 2010.
Y.K. Lee et al., Enhanced extraction efficiency of Y2O3:Eu3+ thin-film phosphors coated with hexagonally close-packed polystyrene nanosphere monolayers, Applied Physics Letters 91, 041907 (2007) 041907-1-041907-3.

(Continued)

*Primary Examiner* — Natalie Walford
(74) *Attorney, Agent, or Firm* — Robert F. Clark

(57) ABSTRACT

A wavelength-converting plate for a wavelength-converted light emitting diode (LED) assembly. The wavelength-converting plate includes microlenses deposited thereon. The microlenses may have an index of refraction different from the index of refraction of the wavelength-converting plate. The microlenses on the top surface of the plate increase lumen output in a direction normal to the top surface of a wavelength-converting plate.

16 Claims, 4 Drawing Sheets

OTHER PUBLICATIONS

Y.K. Ee et al., Optimization of Light Extraction Efficiency of III-Nitride LEDs With Self-Assembled Colloidal-Based Microlenses, IEEE Journal of Selected Topics in Quantum Electronics, vol. 15, No. 4 (2009) 1218-1225.

K.Y. Ko et al., Enhanced Light Extraction from $SrGa_2S_4:Eu^{2+}$ Film Phosphors Coated with Various Sizes of Polystyrene Nanosphere Monolayers, J. Phys. Chem. C, 112 (2008) 7594-7598.
Abstract, JP 2005268323, Sep. 9, 2005.

* cited by examiner

LED WAVELENGTH-CONVERTING PLATE WITH MICROLENSES

TECHNICAL FIELD

The present application relates to light emitting diode (LED) light sources and, more particularly, to an LED wavelength-converting plate with microlenses.

BACKGROUND

Known LED chips generate light in a specific region of the light spectrum. The light output from the LED may be, for example, blue, red or green, depending on the material composition of the LED. When it is desired to construct an LED light source that produces a color different from the output color of the LED, it is known to convert the LED light output having a peak wavelength (the "primary light") to light having a different peak wavelength (the "secondary light") using luminescence/fluorescence.

The luminescent/fluorescence process involves absorbing the primary light by a wavelength-converting material such as a phosphor or mixture of phosphors thereby exciting the phosphor material, which emits the secondary light. The peak wavelength of the secondary light depends on the type of phosphor material, which can be chosen to provide secondary light having a particular peak wavelength. This process may be generally referred to as "wavelength conversion" and an LED combined with a wavelength-converting material, such as phosphor, to produce secondary light, may be described as a "phosphor-converted LED" or "wavelength-converted LED."

In a known configuration, an LED die, such as a III-V nitride die, is positioned in a reflector cup package and a volume, conformal layer or a thin film including wavelength-converting material is deposited directly on the surface of the die. In another known configuration, the wavelength-converting material may be provided in a solid, self-supporting flat plate, such as a ceramic plate, single crystal plate, or thin film structure. The plate may be attached to the LED, e.g. by wafer bonding, sintering, gluing, etc. Such a plate may be referred to herein as a "wavelength-converting plate." Another known approach is to provide the wavelength-converting material in a solid, self-supporting dome formed separately from the LED and attached thereto.

For design and/or cost reasons, a wavelength-converting plate configuration may sometimes be desirable. One drawback associated with using a wavelength-converting plate is light directed forwardly from the light emitting surface of the device may be lost through side emissions. Light emitted in the wavelength-converting plate at angles larger than the total internal reflection (TIF) critical angle has an increased probability to be lost to side emission or absorption.

BRIEF DESCRIPTION OF THE DRAWINGS

Reference should be made to the following detailed description which should be read in conjunction with the following figures, wherein like numerals represent like parts.

DETAILED DESCRIPTION

A wavelength-converting plate consistent with the present disclosure generally includes a plurality of microlenses deposited thereon. The microlenses may be thermally treated to deform the microlenses into a dome-shape. The wavelength-converting plate may be combined into a wavelength-converted LED package whereby light emitted by an LED passes through the bottom surface of the plate and through the microlenses deposited on the plate. The microlenses generally allow more light to escape from the wavelength-converting plate as a whole, and particularly in the forward direction, i.e. normal to the top surface of the wavelength-converting plate. It is believed more light escapes in the forward direction because the microlenses may loosen the critical condition for total internal reflection (TIR) from the wavelength-converting plate.

Figure 1:
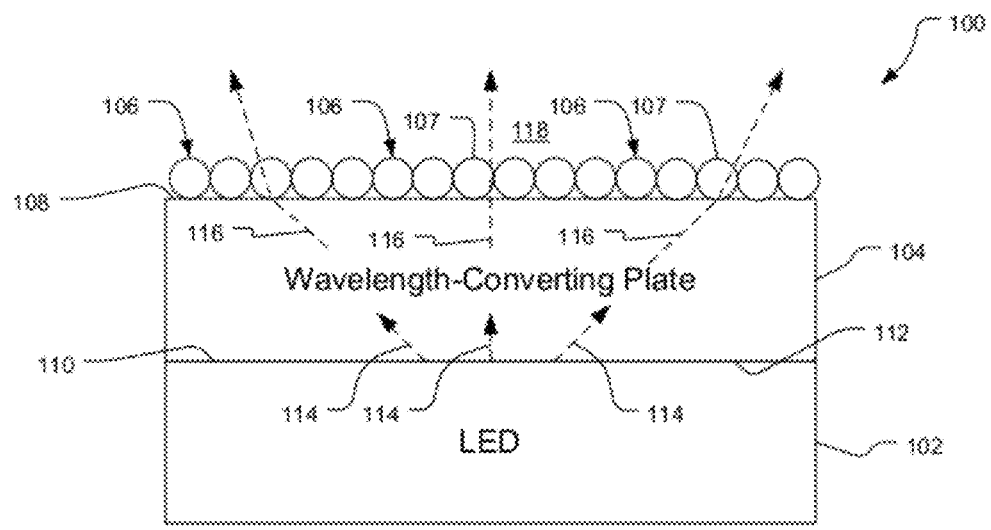
FIG. 1 diagrammatically illustrates one embodiment of a wavelength-converted LED including a wavelength-converting plate consistent with the present disclosure.

FIG. 1 diagrammatically illustrates a wavelength-converted LED assembly 100 consistent with the present disclosure. The illustrated assembly includes a known LED 102 and a wavelength-converting plate 104 having a plurality of microlenses 106 deposited on a top surface 108 thereof consistent with the present disclosure. The LED 102 emits primary light at a peak wavelength through an emitting surface 110 thereof. The bottom surface 112 of the wavelength-converting plate 104 is positioned in opposed facing relationship to the emitting surface 110 of the LED 102. It is to be understood that FIG. 1 is provided in diagrammatic form for ease illustration and explanation, and, for example, the bottom surface 112 of the wavelength converting plate 104 and the emitting surface 110 the LED 102 may have substantially different (roughened, structured, etc.) character from the indicated flat/polished surfaces, depending on the desired optical out-coupling and in-coupling.

Primary light e.g. indicated by arrows 114, emitted from the emitting surface 110 of the LED 102, passes through the bottom surface 112 of the wavelength-converting plate 104 and excites wavelength-converting material therein, which emits the secondary light, e.g. indicated by arrows 116. The secondary light (and perhaps some of the primary light) passes through the top surface 108 of the wavelength-converting plate 104 and into the microlenses 106. The microlenses cause the light emitted from the top surface 108 of the wavelength-converting plate to be more forwardly directed than the light would be in the absence of the microlenses 106. In one embodiment, the index of refraction of the microlenses 106 may be different from the index of refraction of the wavelength-converting plate 104.

The LED 102 may be any known LED, including, but not limited to a nitride III-V LED such as an InGaN LED. The wavelength-converting plate 104 may take any known wavelength-converting plate configuration and is generally a self-supporting flat plate, such as a ceramic plate, single crystal plate, or thin film structure having a wavelength-converting material or mixture of wavelength-converting materials therein. In one embodiment, the wavelength-converting plate 104 may be constructed in a known manner from a ceramic material and the wavelength-converting material in the wavelength-converting plate may be a known phosphor or mixture of phosphors. Known wavelength-converting plate compositions include, but are not limited to YAG:Ce, LuAG:Ce, Sr—SiON:Eu, etc, which may be formed into a wavelength-converting plate using known ceramic, thin film deposition, or crystal growth methods. Again, the LED 102 and the wavelength-converting plate 104 may have substantially different (roughened, structured, etc.) surface characteristics from the illustrated surface characteristics, depending on the desired out-coupling and in-coupling.

The wavelength-converting plate 104 may be coupled in a known manner to the LED 102 so that light from the light emitting surface 110 of the LED 102 passes through the bottom surface 112 of the wavelength-converting plate 104. Known methods of coupling a wavelength-converting plate to an LED include, for example, wafer bonding, sintering, gluing, etc. Examples of ceramic wavelength-converting plates, wavelength-converting materials useful therein, and methods of constructing a wavelength-converting LED incorporating such plates are described in U.S. Pat. Nos. 7,554,258 and 7,361,938 the teachings of which are incorporated herein by reference.

The microlenses 106 on the top surface 108 of the wavelength-converting plate 104 may be discrete elements having a size, shape and/or refractive index chosen to allow more light to escape from the wavelength-converting plate 104 in the forward direction than would escape in the absence of the microlenses 106. The microlenses 106 may be formed from a variety of materials or mixture of materials, including materials having a refractive index the same as or similar to the wavelength-converting plate 104, in any of a variety of shapes. In one embodiment, the microlenses 106 may be formed from a different material than the wavelength-converting plate 104 and may have a refractive index between the refractive index of the wavelength-converting plate 104 and the medium 118 (e.g. air having index of refraction of about 1.0003) contacting the top surface 107 of the microlenses 106.

The microlenses 106 may be discrete monospheres, e.g. as illustrated in FIG. 1, formed, for example, of silica or a polymer including, but not limited to polymethylmethacrylate (PMMA) or polystyrene (PS). Other polymer or non-polymer materials, such as silicone, YAG or alumina particles may be used to form the microlenses 106. The microlenses 106 may be synthesized by know methods. For example, PMMA and PS microlenses 106 may be synthesized using a known free-radical-initiated emulsion polymerization process. Particles useful as microlenses 106 consistent with the present disclosure may also be commercially available from a variety of sources, such as Polysciences, Inc., Warrington, Pa.

The largest dimension of each microlens 106, e.g. the diameter in the case of spherical microlenses, may be less than 0.5 times the smallest dimension of the wavelength-converting plate 104 so that a plurality of similarly sized microlenses 106 may be provided on the top surface 108 of the plate 104. In one embodiment wherein the microlenses 106 are monospherical and the wavelength-converting plate 104 has a length of about 1.0 mm and a width of about 1.0 mm, the diameter of the microlenses 106 may be in the range of about 0.5 microns (μm) to 50.0 μm. In another embodiment, the diameter of the microlenses may be in the range of about 0.5 μm to 1.0 μm. The microlenses 106 may each have approximately the same dimension, e.g. diameter, or the dimensions of the microlenses 106 may be different.

Figure 2:
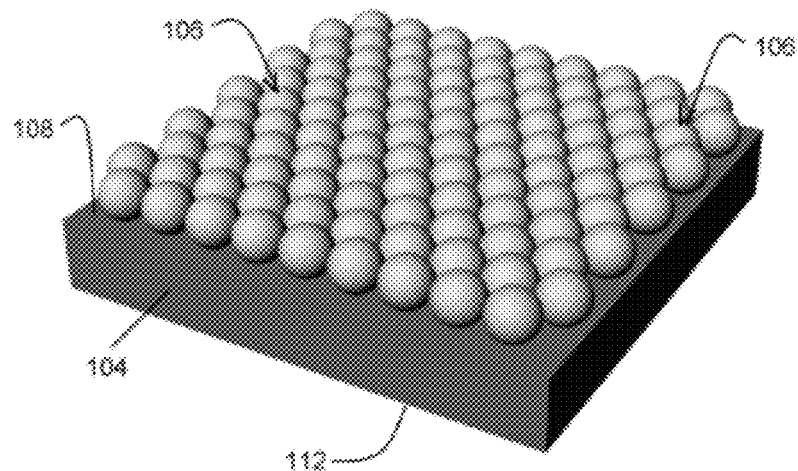
FIG. 2 diagrammatically illustrates a wavelength-converting plate consistent with the present disclosure in perspective view.

FIG. 2 diagrammatically illustrates, in perspective view, a wavelength-converting plate 104 including microlenses 106 consistent with the present disclosure. In the illustrated embodiment, the microlenses 106 are configured as discrete monospheres deposited on the top surface 108 of the wavelength-converting plate 104 in a monolayer (i.e. a single layer). As shown, the microlenses 106 may be closely packed in the monolayer to cover the top surface 108 of the wavelength-converting plate 104. Although the microlenses 106 are not required to be in a closely contacting relationship to each other as shown in FIGS. 1 and 2, the closer the monolayer is packed, i.e. the closer the microlenses 106 are to each other, the better the coupling of light from the wavelength-converting plate 104 through the microlenses 106.

Also, although a monolayer provides for good coupling of light therethrough, some or all of the microlenses 106 may have other microlenses 106 stacked on top thereof to provide multiple-layers or partial multiple layers of microlenses 106. In addition, a wavelength-converting plate 104 consistent with the present disclosure may include one or more layers deposited only on the bottom surface 112 thereof instead of on the top surface 108, or one or more layers may be provided on both the top 108 and bottom 112 surfaces. Using multiple layers of microlenses 106 on the top 108 and/or bottom 112 surface of the wavelength-converting plate 104 or providing layers of microlenses 106 only on the bottom surface 112 of the wavelength-converting plate 104, may reduce the coupling of light in the forward direction but may improve angular color spread ($\Delta Cx$, $\Delta Cy$) associated with the wavelength-converted LED assembly 100.

Figure 3:
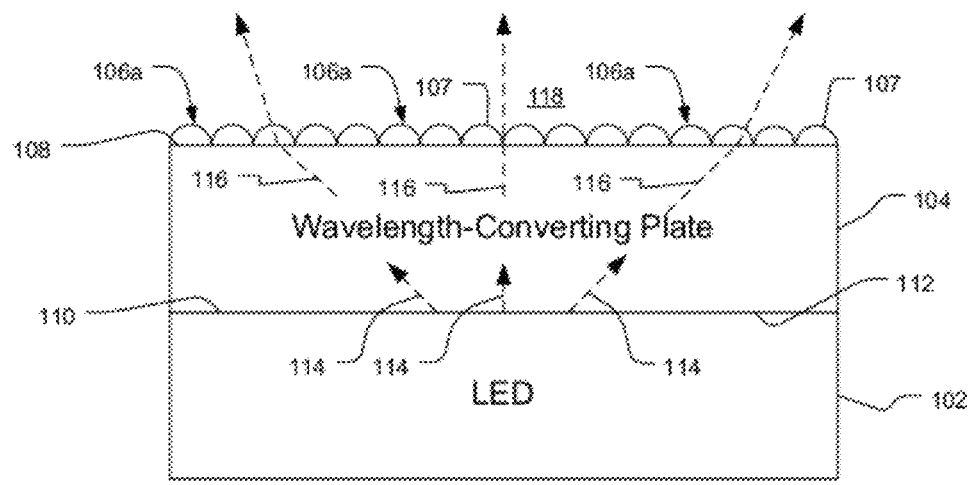
FIG. 3 diagrammatically illustrates another embodiment of a wavelength-converted LED including a wavelength-converting plate consistent with the present disclosure.
Figure 4:
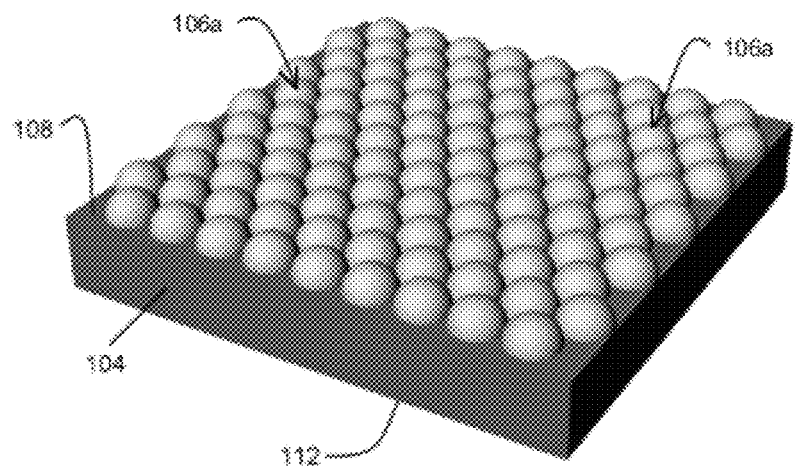
FIG. 4 diagrammatically illustrates another wavelength-converting plate consistent with the present disclosure in perspective view.

Once the microlenses 106 are deposited on the wavelength-converting plate 104 they may be deformed, e.g. by thermal treating, into other shapes, for example a dome-shape, to provide improved coupling of light from the wavelength-converting plate 104. As shown in FIGS. 3 and 4, for example, monospherical microlenses may be partially melted by heating to form dome-shaped microlenses 106a. The temperature and time required to partially melt the microlenses into dome-shaped microlenses 106a depends on the microlens material and size. In one embodiment including PS monospherical microlenses 106 of about 1 μm in diameter, the coated wavelength-converting plate 104 may be heated to about 150 degrees Celsius for about 25 minutes to partially melt the microlenses 106 into a dome-shape.

Figure 5:
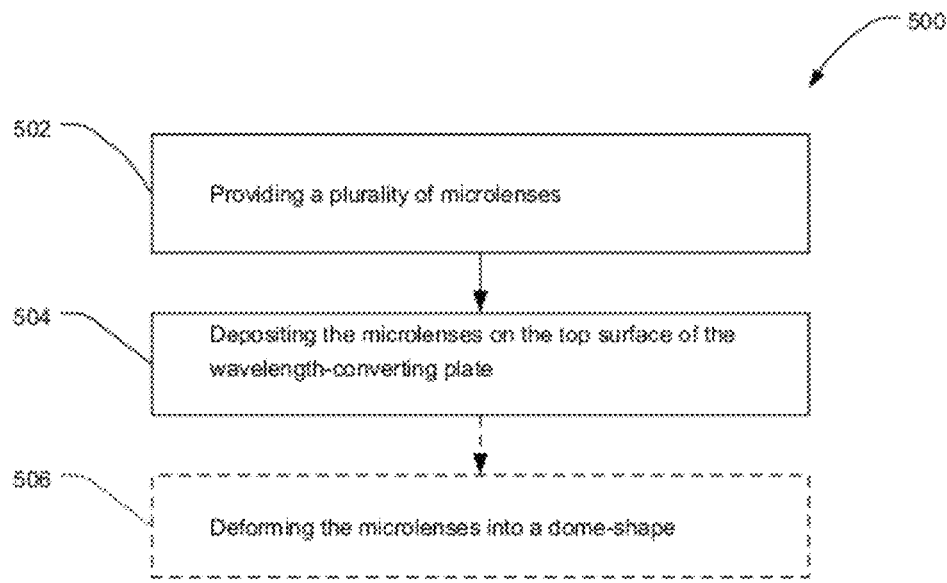
FIG. 5 is a block flow diagram illustrating one method of increasing lumen output in a direction normal to the top surface of a wavelength-converting plate consistent with the present disclosure.
Figure 6:
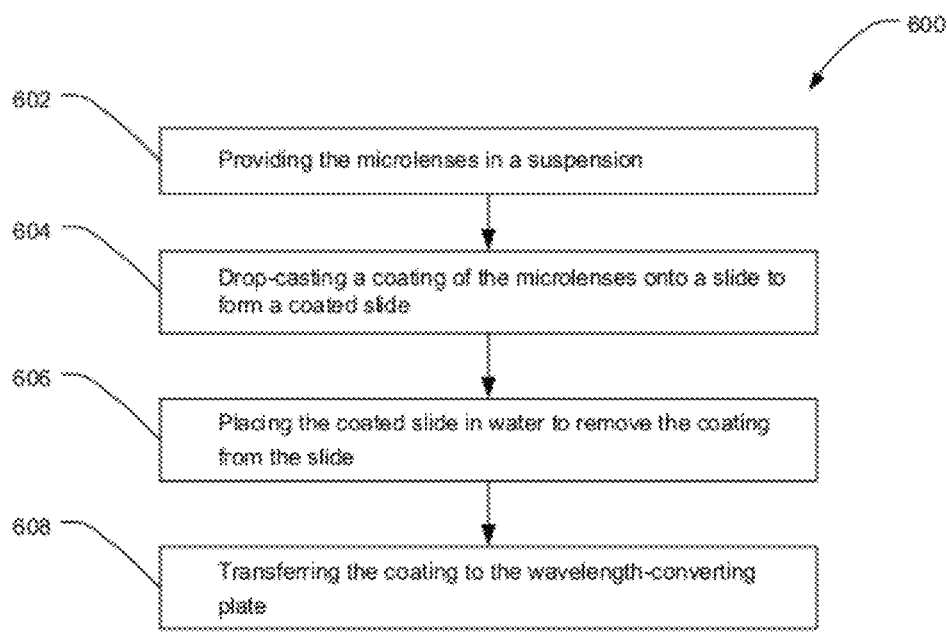
FIG. 6 is a block flow diagram illustrating a method of depositing microlenses on a wavelength-converting plate consistent with the present disclosure.

FIGS. 5 and 6 are block flow diagrams illustrating exemplary methods consistent with the present disclosure. The illustrated block flow diagrams may be shown and described as including a particular sequence of steps. It is to be understood, however, that the sequence of steps merely provides an example of how the general functionality described herein can be implemented. The steps do not have to be executed in the order presented unless otherwise indicated.

As shown in FIG. 5, in a method consistent with the present disclosure microlenses, which may have an index of refraction different from the index of refraction of a wavelength-converting plate, may be provided 502. The microlenses may be deposited 504 on the top surface of the wavelength-converting plate, e.g. in a monolayer. Depositing of the microlenses may be accomplished using a variety of means, including but not limited to drop-casting, dip-coating, spin-coating, evaporation-induced self-assembly (EISA), inverse Langmuir-Blodgett transfer or electrophoretic deposition. Once the micro-lenses are deposited on the wavelength-converting plate the plate may be used without further treatment. Optionally, however, the microlenses may be deformed 506 into dome-shaped structures, e.g. using thermal treatment, as illustrated, for example, in FIGS. 3 and 4.

FIG. 6 is a block flow diagram illustrating one exemplary embodiment for depositing microlenses in a monolayer on a wavelength-converting plate consistent with the present disclosure. In the exemplary embodiment illustrated in FIG. 6, microlenses are provided 602 in a suspension. In one embodiment, for example, the microlenses may be monospherical PS or PMMA microlenses having a diameter of about 1 μm, and 1-5% microlenses by weight may be provided in a water or ethanol solvent. The microlenses may be drop-cast 604 in a known manner onto a smooth slide, e.g. a glass slide, and then dried to form a coating of microlenses on the slide. The coated slide may be dipped into water 606, e.g. de-ionized water. Due to the hydrophobicity of the microlenses, the coating of microlenses may peel off the slide when the slide is placed in the water and may float on the surface of the water. The coating of microlenses may then be transferred to the wavelength-converting plate 608, e.g. by contacting the plate with the coating of microlenses.

Figure 7:
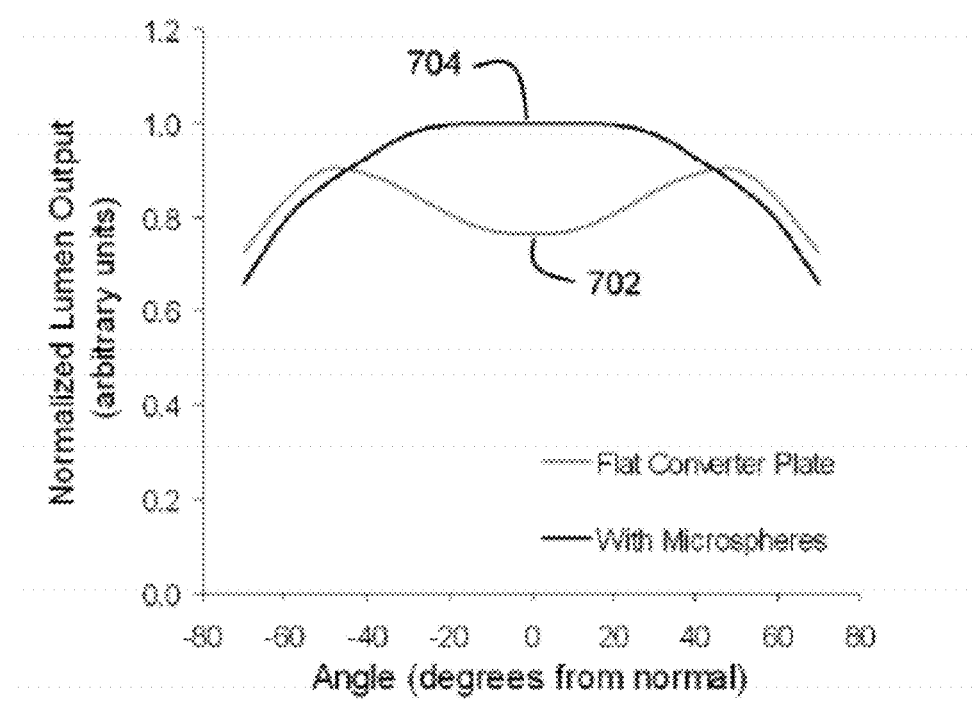
FIG. 7 includes plots of normalized lumen output vs. degrees from normal illustrating performance of a wavelength-converting plate consistent with the present disclosure.

FIG. 7 includes plots 702, 704 of peak-normalized lumen output vs. angle (degrees from normal) to a wavelength-converting plate illustrating performance advantages of a wavelength-converting plate 104 with microlenses 106 thereon consistent with the present disclosure. Plot 702 illustrates performance of an uncoated wavelength-converting plate, and plot 704 illustrates performance of the same wavelength-converting plate after monospherical PS microlenses of about 1 μm in diameter are deposited thereon in a manner consistent with the present disclosure. As shown, the lumen output normal to the surface of the wavelength-converting plate increases by greater than 20% compared to an uncoated plate when microlenses are provided on the wavelength-converting plate. In addition, the lumen output at lower angles for a wavelength-converting plate including microlenses appears to be reduced compared to an uncoated plate.

There is, therefore, provided a wavelength-converting plate including a plurality of microlenses deposited thereon. The wavelength-converting plate may be combined into a wavelength-converted LED package whereby light emitted by an LED passes through the bottom surface of the plate and through the microlenses deposited on the plate. The microlenses generally allow more light to escape from the wavelength-converting plate in the forward direction, i.e. normal to the emitting surface of the LED and the top surface of the wavelength-converting plate, compared to wavelength-converting plate without microlenses thereon.

According to one aspect of the disclosure, there is provided a light source including a light emitting diode (LED) configured to emit primary light from an emitting surface and a wavelength-converting plate. The wavelength-converting plate has a bottom surface in opposed facing relationship to the light emitting surface of the LED, and has a wavelength-converting material therein configured to emit secondary light in response to the primary light being imparted thereon. A plurality of microlenses is deposited on the wavelength-converting plate. The microlenses may have an index of refraction different from an index of refraction of the wavelength-converting plate.

According to another aspect of the disclosure, there is provided a wavelength-converting plate for a wavelength-converted light emitting diode (LED) assembly including an LED configured to emit primary light. The wavelength-converting plate includes a top surface and a bottom surface for positioning in opposed facing relationship to an emitting surface of the LED. A wavelength-converting material is provided in the wavelength-converting plate and is configured to emit secondary light through the top surface in response to the primary light being imparted thereon. A plurality of microlenses are deposited on the top surface of the wavelength-converting plate. The microlenses may have an index of refraction different from an index of refraction of the wavelength-converting plate.

According to another aspect of the disclosure, there is provided a method of increasing lumen output in a direction normal to the top surface of a wavelength-converting plate in a wavelength-converted LED assembly wherein the wavelength-converting plate is configured to receive primary light form the LED and provide secondary light through the top surface in response thereto. The method includes providing a plurality of microlenses, which may have an index of refraction different from the index of refraction of the wavelength-converting plate; and depositing the microlenses on the wavelength-converting plate.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A light source comprising:
   a light emitting diode (LED) configured to emit primary light from an emitting surface;
   a wavelength-converting plate having a bottom surface in opposed facing relationship to said emitting surface of said LED, said wavelength-converting plate having a wavelength-converting material therein configured to emit secondary light in response to said primary light being imparted thereon; and
   a plurality of microlenses deposited on said bottom surface of said wavelength-converting plate.

2. A light source according to claim 1, wherein said microlenses have an index of refraction different from an index of refraction of said wavelength-converting plate.

3. A light source according to claim 1, wherein said microlenses are further deposited on a top surface of said wavelength-converting plate.

4. A light source according to claim 1, wherein said microlenses are deposited in a monolayer.

5. A light source according to claim 1, wherein said microlenses are dome-shaped.

6. A light source according to claim 1, wherein said microlenses are monospheres.

7. A wavelength-converting plate for a wavelength-converted light emitting diode (LED) assembly including an LED configured to emit primary light, said wavelength-converting plate comprising:
   a top surface and a bottom surface, said bottom surface for positioning in opposed facing relationship to an emitting surface of the LED, and a wavelength-converting material configured to emit secondary light through the top surface in response to the primary light being imparted thereon; and a plurality of microlenses deposited on said bottom surface of said wavelength-converting plate.

8. A wavelength-converting plate according to claim 7, wherein said microlenses have an index of refraction different from an index of refraction of said wavelength-converting plate.

9. A wavelength-converting plate according to claim 7, wherein said microlenses are further deposited on the top surface of said wavelength-converting plate and said microlenses on said top surface have an index of refraction between an index of refraction of said wavelength-converting plate and an index of refraction of a medium in contact said microlenses on said top surface.

10. A wavelength-converting plate according to claim 7, wherein said microlenses are deposited in a monolayer.

11. A wavelength-converting plate according to claim 7, wherein said microlenses are dome-shaped.

12. A wavelength-converting plate according to claim 7, wherein said microlenses are monospheres.

13. A wavelength-converting plate according to claim 7, wherein said microlenses are comprised of at least one of silica, a polymer, silicone, yttrium aluminum garnet (YAG), or alumina.

14. A wavelength-converting plate according to claim 13 wherein the polymer is polymethylmethacrylate (PMMA) or polystyrene (PS).

15. A wavelength-converting plate according to claim 7, wherein said microlenses are monospherical having a diameter in a range of about 0.5 μm to 50.0 μm.

16. A wavelength-converting plate according to claim 15, wherein said microlenses have a diameter in the range of about 0.5 μm to 1.0 μm.

* * * * *